US012009826B1

(12) United States Patent
Shtin et al.

(10) Patent No.: US 12,009,826 B1
(45) Date of Patent: Jun. 11, 2024

(54) PHASE NOISE SUPPRESSION FOR REFERENCE OSCILLATOR

(71) Applicant: Anritsu Company, Morgan Hill, CA (US)

(72) Inventors: Nikolay Shtin, Morgan Hill, CA (US); Oleksandr Chenakin, Morgan Hill, CA (US); Suresh P. Ojha, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 17/983,253

(22) Filed: Nov. 8, 2022

(51) Int. Cl.
*H03L 7/093* (2006.01)
*H03L 7/099* (2006.01)

(52) U.S. Cl.
CPC .............. *H03L 7/093* (2013.01); *H03L 7/099* (2013.01)

(58) Field of Classification Search
CPC ................................ H03L 7/093; H03L 7/099
USPC .................................. 331/96, 107 DP, 117 D
See application file for complete search history.

(56) References Cited

U.S. PATENT DOCUMENTS 5,841,322 A     11/1998   Ivanov et al.
7,075,378 B2    7/2006    Howe et al.

FOREIGN PATENT DOCUMENTS

WO    WO-9532435 A1 *  11/1995    ............. G01R 29/26
WO    WO-9948209  A2 *  9/1999    ............... H03B 5/18

OTHER PUBLICATIONS

A. K. Poddar and U. L. Rohde, "The pursuit for low cost and low phase noise synthesized signal sources: Theory & optimization," 2014 IEEE International Frequency Control Symposium (FCS), 2014, pp. 1-9.
M. Bahmanian and J. C. Scheytt, "A 2-20-GHz Ultralow Phase Noise Signal Source Using a Microwave Oscillator Locked to a Mode-Locked Laser," in IEEE Transactions on Microwave Theory and Techniques, vol. 69, No. 3, pp. 1635-1645, Mar. 2021.
J. W. Zobel et al., "Comparison of Optical Frequency Comb and Sapphire Loaded Cavity Microwave Oscillators," in IEEE Photonics Technology Letters, vol. 31, No. 16, pp. 1323-1326, 15 Aug. 15, 2019.
A. Gorevoy, "A Low Noise Oscillator Based on a Conventional Dielectric Resonator", Microwave Journal, vol. 56, Ed. 11, pp. 84-94, 2013.
J. Everard and K. Theodoropoulos, "Ultra-Low Phase Noise Ceramic based Dielectric Resonator Oscillators," 2006 IEEE International Frequency Control Symposium and Exposition, 2006, pp. 869-874.
D. P. Tsarapkin, and N. A. Shtin, "Performance Limits of Microwave Oscillators with Combined Stabilization," Proceedings of the 16th European Frequency and Time Forum, 2002, pp. C028-C031.
N. Shtin and J. M. L. Romero, "Ultra low phase noise C-band oscillators with combined frequency stabilization," 2010 Asia-Pacific Microwave Conference, 2010, pp. 378-381.

(Continued)

*Primary Examiner* — Arnold M Kinkead
(74) *Attorney, Agent, or Firm* — Kilpatrick Townsend & Stockton LLP

(57) ABSTRACT

Circuits, methods, and apparatus that can reduce or suppress phase noise in a frequency synthesizer. A phase-noise-suppression system can detect phase noise in an input signal, amplify the detected phase noise, subtract the detected phase noise from the input signal, and provide an output signal having reduced phase noise.

20 Claims, 7 Drawing Sheets

(56) References Cited

OTHER PUBLICATIONS

E. N. Ivanov, M. E. Tobar and R. A. Woode, "Experimental study of the noise phenomena in microwave components," Proceedings of 1996 IEEE International Frequency Control Symposium, 1996, pp. 858-865.

Jiang Li and Kerry Vahala, "Small-sized, ultra-low phase noise photonic microwave oscillators at X-Ka bands," Optica 10, 33-34, 2023.

Manoj Kalubovilage, Mamoru Endo, and Thomas R. Schibli, "Ultra-low phase noise microwave generation with a free-running monolithic femtosecond laser," Opt. Express 28, 25400-25409, 2020.

* cited by examiner

PHASE NOISE SUPPRESSION FOR REFERENCE OSCILLATOR

BACKGROUND

Wireless communication has become ubiquitous in daily life. Cell phones, computers, and home networks, as well as a growing array of smart and connected devices, such as speakers, lights, and home appliances, all communicate wirelessly. The wireless communication systems for these devices, as well as for other systems such as radar and data conversion systems, can be tested, during manufacturing and during use, using signal generators in RF test equipment.

The signal generators in RF test equipment can include one or more frequency synthesizers. A frequency synthesizer is an electronic system that translates an input reference frequency signal to an output signal at a different frequency. An input reference frequency can be provided by a crystal oscillator or other temperature insensitive oscillating device. The translated output signal can be provided to a circuit or system being tested.

The output signal from a frequency synthesizer can have an amount of phase noise, where the phase noise is a manifestation of instability of the output frequency of the frequency synthesizer and is observed as random frequency fluctuations around the desired output frequency. Phase noise can be a limiting factor in the sensitivity of tests being performed on a system. As a result, it can be desirable to reduce the phase noise of frequency synthesizers in signal generation equipment.

A primary source of this phase noise can be the crystal oscillator or other temperature insensitive oscillating device used to provide the input reference frequency signal. This phase noise can pass through a frequency synthesizer to the output signal. Phase noise at the output signal can degrade measurement performance of the signal generators in RF test equipment.

Thus, what is needed are circuits, methods, and apparatus that can reduce or suppress phase noise in a frequency synthesizer.

SUMMARY

Accordingly, embodiments of the present invention can provide circuits, methods, and apparatus that can reduce or suppress phase noise in a frequency synthesizer. An illustrative embodiment of the present invention can reduce phase noise in frequency synthesizers by suppressing phase noise in an input signal provided by a crystal oscillator or other temperature insensitive oscillating device or circuit. A phase-noise-suppression system can detect phase noise in the input signal, amplify the detected phase noise, subtract the phase noise from the input signal, and provide an output signal having reduced phase noise.

These and other embodiments of the present invention can provide a phase-noise-suppression system that includes a frequency discriminator. The phase-noise-suppression system can include a voltage-controlled phase shifter that receives an input from a crystal oscillator, such as an oven-controlled crystal oscillator or other oscillating device or circuit. The voltage-controlled phase shifter can provide an input to a frequency multiplier that can generate a harmonic of the input. The frequency discriminator can detect frequency changes that are caused by phase noise. The frequency discriminator can receive the frequency multiplied signal and convert the frequency changes in the frequency multiplied signal into an output signal. The amplitude of the output signal from the frequency discriminator can be proportional to the magnitude of the frequency changes of the frequency multiplied signal. This output signal can be provided to a main-loop amplifier circuit. The main-loop amplifier circuit can amplify and filter the output signal from the frequency discriminator. The main-loop amplifier circuit can provide a control signal to adjust the phase through the voltage-controlled phase shifter in order to subtract phase noise from the signal from the crystal oscillator. This can allow the voltage-controlled phase shifter to provide an output signal having a reduced phase noise. The output of the frequency discriminator can also be provided to an auxiliary-loop amplifier that can filter and amplify the output and provide an output to adjust the frequency of a resonator in the frequency discriminator.

These and other embodiments of the present invention can provide a phase-noise-suppression system that includes a resonator circuit, such as a dielectric resonator circuit. The phase-noise-suppression system can include a voltage-controlled phase shifter that receives an input from a crystal oscillator, such as an oven-controlled crystal oscillator or other oscillating device or circuit. The voltage-controlled phase shifter can provide an input to a frequency multiplier that can generate a harmonic of its input. The output of the frequency multiplier can be provided to the dielectric resonator circuit and a phase detector. The phase detector can detect input phase noise by comparing the phase of the output of the frequency multiplier and the phase of an output from the dielectric resonator circuit. The phase detector can provide a voltage having an amplitude that is proportional to the phase difference between these two signals. The output of the phase detector can be provided to a main-loop amplifier circuit. The main-loop amplifier circuit can amplify and filter the output signal from the phase detector and provide a control signal to adjust the phase through the voltage-controlled phase shifter. This can subtract phase noise from the input signal from the crystal oscillator and can allow the voltage-controlled phase shifter to provide an output signal having a reduced phase noise. The output of the phase detector can also be provided to an auxiliary-loop amplifier that can filter and amplify the output of the phase detector. The auxiliary-loop amplifier can provide a signal to adjust the resonant frequency of the resonator in the dielectric resonator circuit.

These and other embodiments of the present invention can provide a frequency discriminator for use in a phase-noise-suppression system. The frequency discriminator can include a hybrid coupler that can receive an input signal. The input signal can be provided by a voltage-controlled phase shifter, a frequency multiplier driven by a voltage-controlled phase shifter, a power amplifier driven by a frequency multiplier that is in turn driven by a voltage-controlled phase shifter, or another source. The input signal can be provided by a first output port of the hybrid coupler to an input microstrip line of a resonator circuit, such as a dielectric resonator circuit. The input microstrip line can be further coupled to a first varactor diode that can be used for non-dynamic tuning of the resonator's input coupling in the dielectric resonator circuit. The reverse coupled or isolated port of the hybrid coupler can be coupled to a power detector. The output of the power detector can be converted to a digital signal using an analog-to-digital converter. The output of the analog-to-digital converter can be provided to a field-programmable gate array or other logic circuit for processing. Based at least in part on the output of the power detector, a digital-to-analog converter can be set to provide a voltage to the first varactor diode to adjust the input coupling of the dielectric or other resonator. Since this tuning is relatively slow and possibly software controlled, it can be referred to as non-dynamic tuning. This tuning can be done only occasionally, and as such can be considered to be a DC tuning. The second output port of the hybrid coupler can be terminated in a 50 ohm impedance. The dielectric resonator circuit can include a dynamic tuning port that can be driven by an amplified and filtered output from a phase detector. The amplified filtered output from the phase detector can be received by a second varactor diode and a tuning microstrip line. A remote end of the tuning microstrip line can couple to a third varactor diode. In these and other embodiments of the present invention, the first, second, and third varactors can be formed of one, two, or more than two individual varactor diodes.

These and other embodiments of the present invention can provide a phase-noise-suppression system. This system can include an input narrow band bandpass filter to remove high-frequency phase noise from an input signal. This bandpass filter can be a surface acoustic wave (SAW) filter, thin-film bulk acoustic resonator (FBAR), or other type of filter. The output of the bandpass filter can be received by a first voltage-controlled phase shifter. The first voltage-controlled phase shifter can be used to subtract phase noise from the signal provided by the bandpass filter. The output of the first voltage-controlled phase shifter can be provided as the output of the phase-noise-suppression system. The output of the first voltage-controlled phase shifter can be received by a frequency multiplier. The frequency multiplier can provide a second, fourth, or other odd or even harmonic of the output of the first voltage-controlled phase shifter. A power amplifier can be used at the frequency multiplier output to provide high amplitude signal into a frequency discriminator to improve the signal-to-noise ratio of the signal at the frequency discriminator output.

The frequency discriminator can include a hybrid coupler that can receive the output of the power amplifier. The output of the power amplifier can be provided by a first output port of the hybrid coupler to an input microstrip line of a resonator circuit, such as a dielectric resonator circuit. The input microstrip line can be further coupled to a first varactor diode that can be used for non-dynamic tuning of a resonator in the dielectric resonator circuit. Frequency fluctuations in the received signal can be converted to phase fluctuations by the dielectric resonator circuit. The reverse coupled or isolated port of the hybrid coupler can be coupled to a low-noise amplifier. When the input frequency to the hybrid coupler matches the tuned frequency of the dielectric resonator, the dielectric resonator is at maximum efficiency and the input to the low-noise amplifier can be at or near zero. The output of the power amplifier can be coupled through a directional coupler to an attenuator that, along with the directional coupler, can reduce the amplitude of the large signal provided by the power amplifier. The output of the attenuator can be received by a second voltage-controlled phase shifter. The second voltage-controlled phase shifter can be adjusted to maximize the sensitivity and amplitude noise suppression of the phase detector. A phase detector can compare a phase of the output of the second voltage-controlled phase shifter to the phase of the low-noise amplifier and provide a voltage having an amplitude proportional to the phase difference between the two.

The output of the phase detector can be received by a main-loop amplifier circuit. The main-loop amplifier circuit can include one or more filters and one or more amplifiers. For example, the main-loop amplifier circuit can include two high-pass filters interdigitated with two amplifiers. The output of the main-loop amplifier circuit can be received by the first voltage-controlled phase shifter. This signal can subtract phase noise from the signal provided by the input bandpass filter.

The output of the phase detector can further be received by an auxiliary-loop amplifier circuit. The auxiliary-loop amplifier circuit can include one or more filters and one or more amplifiers. For example, the auxiliary-loop amplifier circuit can include two low-pass filters on each side of an amplifier. The output of the auxiliary-loop amplifier circuit can be received by an adjustment or tuning input of the dielectric resonator circuit in the frequency discriminator. For example, the output of the auxiliary-loop amplifier circuit can be received by a first varactor diode and a tuning microstrip line in the dielectric resonator circuit. An RF choke can be used to further filter and remove noise from the output of the auxiliary-loop amplifier circuit. A remote end of the tuning microstrip line can be coupled to a second varactor diode. In this way, the output of the auxiliary-loop amplifier circuit can be used to dynamically tune the dielectric resonator.

In these and other embodiments of the present invention, the frequency responses of the main-loop amplifier circuit and the auxiliary-loop amplifier circuit can be different. For example, the main-loop amplifier can operate at a higher frequency such that high frequency fluctuations in the input signal are amplified and cancelled. The auxiliary amplifier can operate at low frequencies such that the dielectric resonator circuit can be locked to the input signal so the frequency fluctuations of the dielectric resonator can be reduced.

The dielectric resonator circuit can be non-dynamically tuned or adjusted as well. Specifically, the reverse coupled or isolated port of the hybrid coupler can be coupled, for example using a directional coupler, to a power detector. The output of the power detector can be converted to a digital signal using an analog-to-digital converter. The output of the analog-to-digital converter can be provided to a field-programmable gate array or other logic circuit for processing. Based on the output of the power detector, a digital-to-analog converter can be set to provide a voltage to a first varactor diode in the dielectric resonator circuit to adjust the input coupling of the dielectric resonator to provide constant signal level at the input of the low-noise amplifier. Since this tuning is relatively slow and software controlled, it can be referred to as non-dynamic tuning. This tuning can be done only on occasions such as startup and resets and can be considered a DC tuning.

These and other embodiments of the present invention can provide a dielectric resonator circuit. The dielectric resonator circuit can include a metal cavity. The dielectric resonator circuit can include a dielectric puck. The dielectric puck can be located in a cavity in a base. The cavity can be covered by a cavity lid. The dielectric puck can be attached to the cavity lid by a rod. The dielectric puck can be formed of a first type of ceramic while the rod can be formed of a second type of ceramic. A tuning screw can be partially located in the cavity. The cavity lid can be attached to the base, for example using fasteners. A printed circuit board can be placed over the cavity lid. The printed circuit board can include a ground plane having a first slit and a second slit. An input microstrip line can extend over the first slit while a tuning microstrip line can extend over the second slit. Varactor diodes can be located on the printed circuit board and can be attached to the input microstrip line and the tuning microstrip line. The cavity lid can include cutouts aligned with the first slit and the second slit. A cover can be attached to the base over the printed circuit board.

These and other embodiments of the present invention can be used in a phase-locked loop or other frequency synthesizer. These and other embodiments of the present invention can provide a frequency synthesizer that includes a phase-noise-suppression system. The phase-noise-suppression system can receive an input from a crystal oscillator, such as an oven-controlled crystal oscillator or other oscillating device or circuit. The phase-noise-suppression system can reduce phase noise in the signal from the crystal oscillator and provide an output to a phase detector. The output of the phase detector can be filtered and amplified and provided as a control signal to a voltage-controlled oscillator. The output of the voltage-controlled oscillator can be provided to the phase detector through a feedback path that can include a frequency divider, frequency multiplier, a combination of each, or other circuit. The phase detector can compare the output from the phase-noise-suppression system and the output of the feedback path and provide an output voltage based on the phase difference between the two as a control signal to adjust the frequency of the voltage-controlled oscillator. Frequency dividers, frequency multipliers, or other additional circuits can be included between the phase-noise-suppression system and the voltage-controlled oscillator, or elsewhere in the circuit.

While embodiments of the present invention are well-suited for use in phase-locked loops and other frequency synthesizers, these and other embodiments of the present invention can be used in other types of circuits, such as frequency locked loops, delay locked loops, and other types of circuits.

Various embodiments of the present invention can incorporate one or more of these and the other features described herein. A better understanding of the nature and advantages of the present invention can be gained by reference to the following detailed description and the accompanying drawings.

DESCRIPTION OF ILLUSTRATIVE EMBODIMENTS

Figure 1:
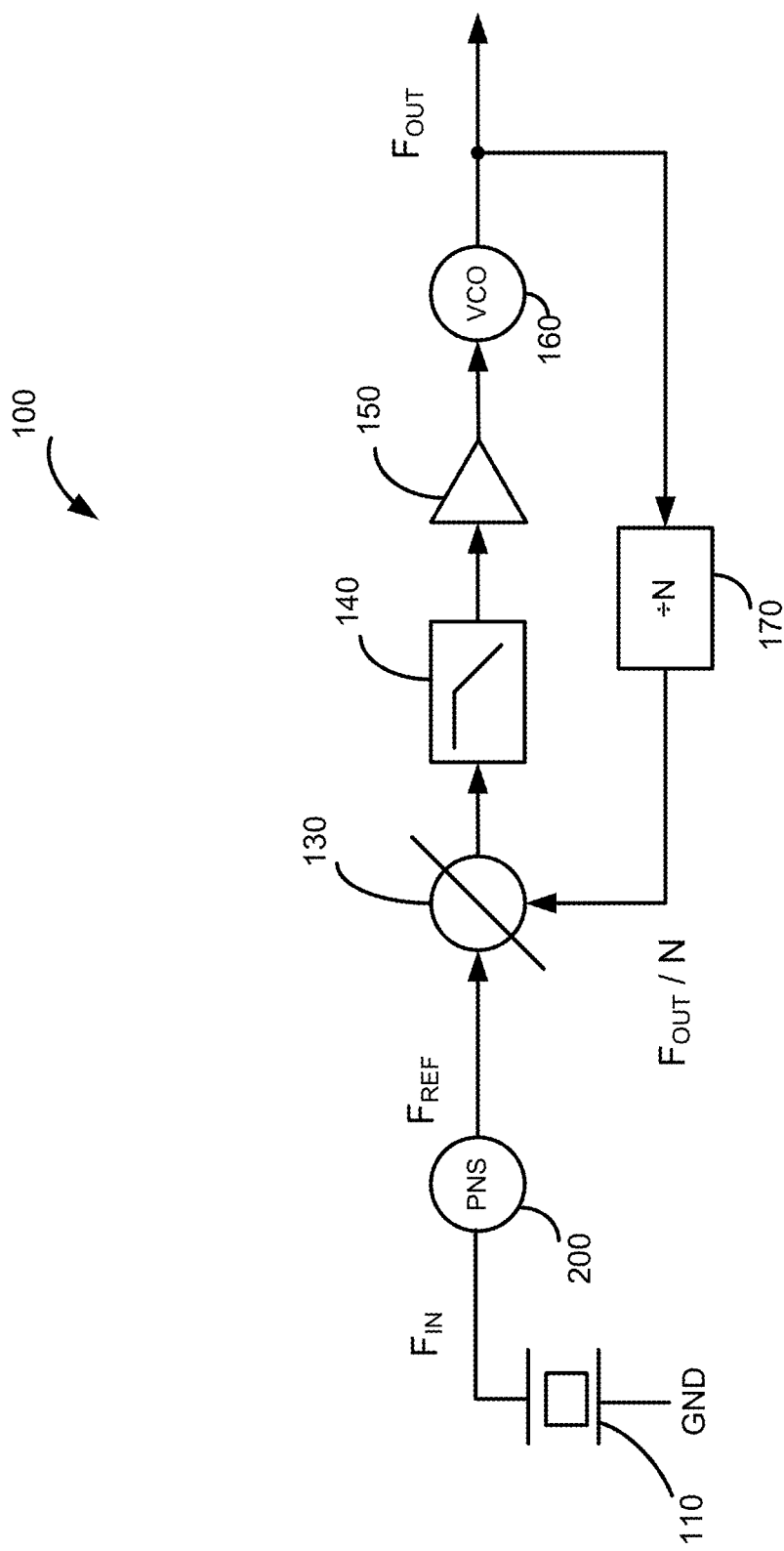
FIG. 1 illustrates a phase-locked loop according to an embodiment of the present invention.

FIG. 1 illustrates a phase-locked loop according to an embodiment of the present invention. Phase-locked loop 100 can be used as a frequency synthesizer. Alternatively, phase-locked loop 100 can be included as a portion of a frequency synthesizer, along with other signal processing circuits, reference signal generators, and other components or circuits.

Phase-locked loop 100 can include crystal oscillator 110. Crystal oscillator 110 can be an oven-controlled crystal oscillator or other oscillating device or circuit. Phase-locked loop 100 can include a phase-noise-suppression system 200. Phase-noise-suppression system 200 can receive an input signal $F_{IN}$ from crystal oscillator 110 and provide an output $F_{REF}$ to phase detector 130.

Phase-locked loop 100 can further include voltage-controlled oscillator 160. Voltage-controlled oscillator 160 can include a tank circuit formed of an inductor and a capacitor (not shown.) Alternatively, voltage-controlled oscillator 160 can be a ring oscillator formed of a number of circuits having a net inversion and connected in a loop, or voltage-controlled oscillator 160 can have a different topology or circuit configuration. Voltage-controlled oscillator 160 can provide an output signal having a frequency $F_{OUT}$.

Phase-locked loop 100 can include a feedback path from an output of the voltage-controlled oscillator 160 to a second input of phase detector 130. The feedback path can include a divider 170. Divider 170 can divide a frequency of the output signal out by an integer, represented here as the value N, though a combination of dividers and multipliers or a multi-modulus divider can be used such that N is a fraction instead of an integer. The output of phase detector 130 can be filtered by lowpass filter 140. The output signal from lowpass filter 140 can be amplified by amplifier 150 and provided as a frequency control input to voltage-controlled oscillator 160. Phase-locked loop 100 can provide an output signal having a frequency $F_{OUT}$ that is N times the frequency of the reference signal $F_{REF}$. Other circuits, such as multipliers and dividers, can be inserted in phase-locked loop 100, for example between phase detector 130 and voltage-controlled oscillator 160.

Figure 2:
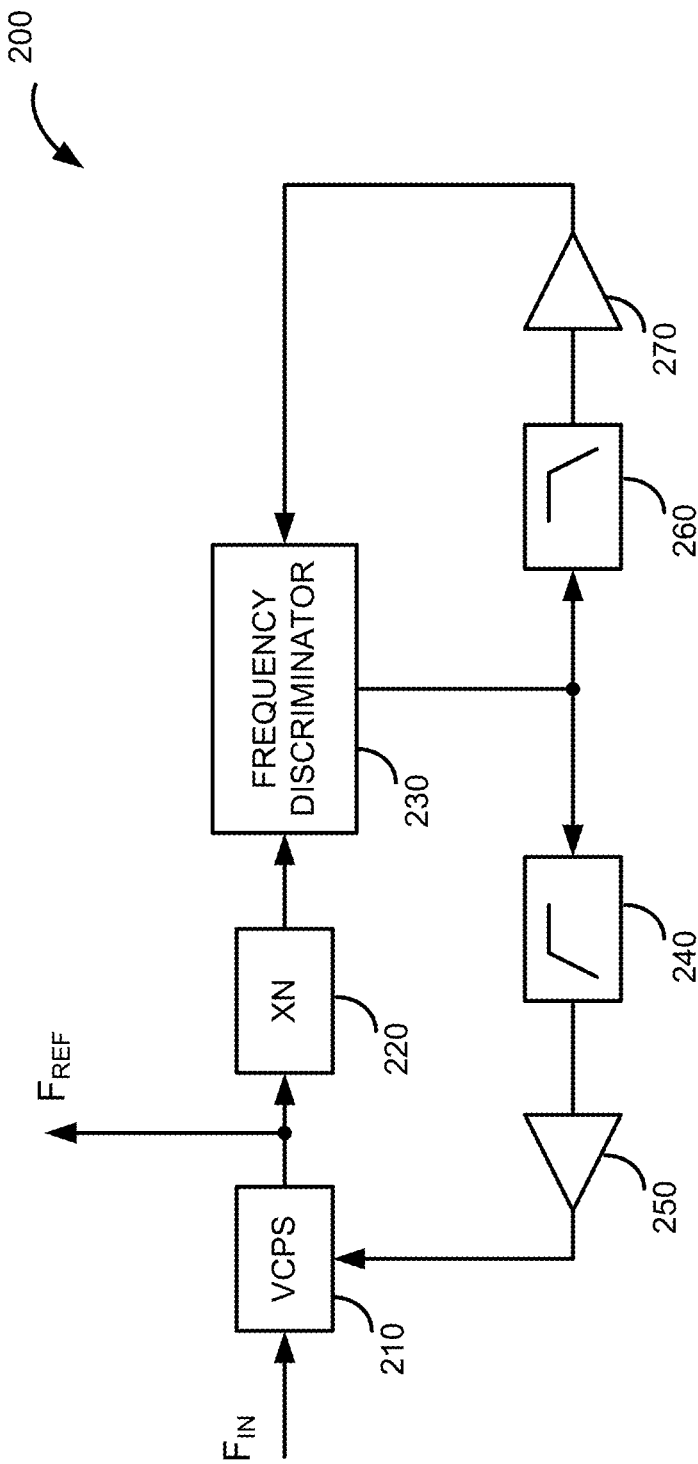
FIG. 2 is a block diagram of a phase-noise-suppression system according to an embodiment of the present invention.

FIG. 2 is a block diagram of a phase-noise-suppression system according to an embodiment of the present invention. Phase-noise-suppression system 200 can receive an input signal $F_{IN}$ from crystal oscillator 110 (shown in FIG. 1), which can be an oven controlled crystal oscillator or other oscillating component or circuit. Input signal $F_{IN}$ can be received by voltage-controlled phase shifter 210, which can provide phase-noise reduced output signal $F_{REF}$. The output of voltage-controlled phase shifter 210 can be provided to frequency multiplier 220. Frequency multiplier 220 can provide an output signal having a frequency that is a harmonic of the frequency of the input signal $F_{IN}$ received by voltage-control phase shifter 210. The frequency multiplied signal from frequency multiplier 220 can be a second, fourth, or other odd or even harmonic of input signal $F_{IN}$. The frequency multiplied signal from frequency multiplier 220 can be received by frequency discriminator 230. Frequency discriminator 230 can detect changes in the frequency of the frequency multiplied signal and convert these changes to an output voltage.

The output of frequency discriminator 230 can be received by a main-loop amplifier circuit including high-pass filter 240 and amplifier 250. In this way, amplifier 250 can amplify the detected changes in frequency of the output of frequency multiplier 220. The output of amplifier 250 can be provided to a control input of voltage-controlled phase shifter 210. Voltage-control phase shifter 210 can thus subtract phase changes from the input signal $F_{IN}$, thereby providing phase-noise reduced output signal $F_{REF}$. The output of frequency discriminator 230 can also be provided to an auxiliary-loop amplifier including low-pass filter 260 and amplifier 270. The auxiliary-loop amplifier can provide a low-frequency correction signal to maintain the frequency of operation of dielectric resonator 410 (shown in FIG. 4) in frequency discriminator 230.

Figure 3:
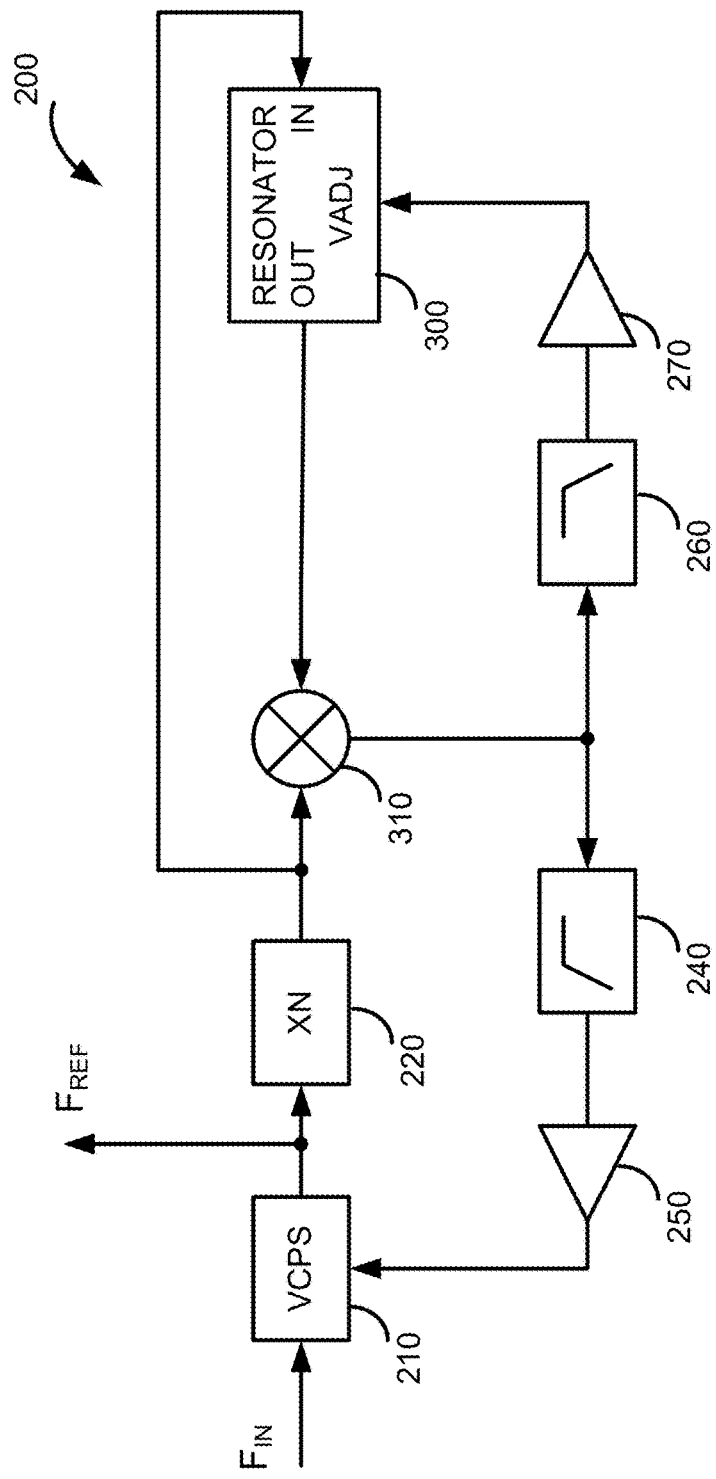
FIG. 3 is another block diagram of a phase-noise-suppression system according to an embodiment of the present invention.

FIG. 3 is another block diagram of a phase-noise-suppression system according to an embodiment of the present invention. Phase-noise-suppression system 200 can include voltage-controlled phase shifter 210 that receives an input from crystal oscillator 110 (shown in FIG. 1), which can be an oven-controlled crystal oscillator or other oscillating device or circuit. Phase-noise-suppression system 200 can provide an input to frequency multiplier 220 that can generate a harmonic of the input signal provided by voltage-controlled phase shifter 210. The output of frequency multiplier 220 can be provided to dielectric resonator circuit 300 and phase detector 310. Phase detector 310 can detect input phase noise by comparing the phase of the output of frequency multiplier 220 and the phase of an output signal from dielectric resonator circuit 300. Phase detector 310 can provide a voltage having an amplitude that is proportional to the phase difference between these two signals.

The output of phase detector 310 can be received by a main-loop amplifier circuit including high-pass filter 240 and amplifier 250. In this way, amplifier 250 can amplify the detected changes in frequency of the output of phase detector 310. The output of amplifier 250 can be provided to a control input of voltage-controlled phase shifter 210. Voltage-control phase shifter 210 can thus subtract phase changes from the input signal $F_{IN}$, thereby providing phase-noise reduced output signal $F_{REF}$. The output of frequency discriminator 230 can also be provided to an auxiliary-loop amplifier including low-pass filter 260 and amplifier 270. The auxiliary-loop amplifier can provide a low-frequency correction signal to maintain the frequency of operation of dielectric resonator 410 (shown in FIG. 4) in dielectric resonator circuit 300.

Figure 4:
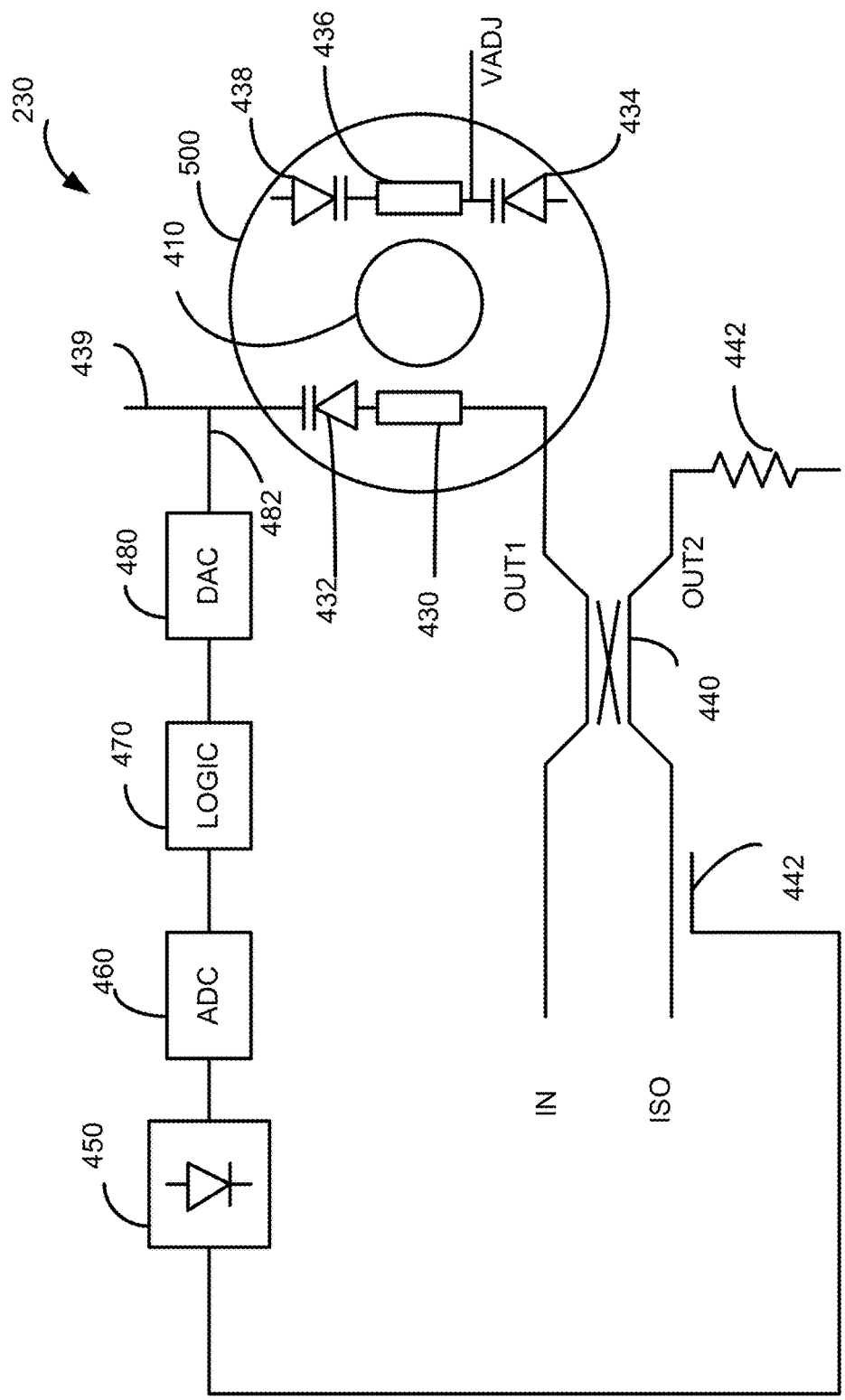
FIG. 4 is a block diagram of a portion of a frequency discriminator according to an embodiment of the present invention.

FIG. 4 is a block diagram of a portion of a frequency discriminator according to an embodiment of the present invention. Frequency discriminator 230 can be used in a phase-noise-suppression system, such as phase-noise-suppression system 200. Frequency discriminator 230 can include hybrid coupler 440 that can receive an input signal at the input port IN. The input signal can be provided by voltage-controlled phase shifter 210 (shown in FIG. 2), frequency multiplier 220 (shown in FIG. 2) driven by voltage-controlled phase shifter 210, power amplifier 520 (shown in FIG. 5) driven by frequency multiplier 220 that is in turn driven by voltage-controlled phase shifter 210, or another source. The input signal can be provided by first output port OUT1 of hybrid coupler 440 to input microstrip line 430 of resonator circuit, which can be dielectric resonator circuit 500. This configuration of hybrid coupler 440 and dielectric resonator circuit 500 can be referred to as a single-channel microwave interferometer. As shown below, this configuration also allows dielectric resonator circuit 500 to be tuned by adjusting a DC voltage at a single varactor diode, first varactor diode 432, in a non-dynamic manner.

More specifically, dielectric resonator circuit 500 can be tuned in various ways. Again, dielectric resonator circuit 500 can be tuned in a non-dynamic or DC manner. Dielectric resonator circuit 500 can be dynamically tuned using phase detector 310 (shown in FIG. 3) that provides an output for frequency discriminator 230. Dielectric resonator circuit 500 can further be tuned by cutting or otherwise adjusting a length of stub 439 that is coupled to input microstrip line 430. Dielectric resonator circuit 500 can also be mechanically tuned using tuning screw 670 that adjusts the size and shape of cavity 630 (both shown in FIG. 6.)

Again, dielectric resonator circuit 500 can be non-dynamically tuned. For example, reverse coupled or isolated port ISO of hybrid coupler 440 can be coupled to power detector 450 through directional coupler 442. Directional coupler 442 can provide a loss of 10 to 15 dB. The output of the power detector can be converted to a digital signal using analog-to-digital converter 460. The output of analog-to-digital converter 460 can be provided to field-programmable gate array or other logic circuit 470 for processing. Based at least in part on the output of power detector 450, a digital-to-analog converter 480 can be set to provide a voltage to first varactor diode 432 to adjust the input coupling of the dielectric or other resonator. Since this tuning is relatively slow and possibly software controlled, it can be referred to as non-dynamic or DC tuning. The second output port OUT2 of hybrid coupler 440 can be terminated in a 50 ohm impedance to ground or other low-impedance.

Dielectric resonator circuit 500 can include a dynamic tuning port that can be driven by an amplified and filtered output from phase detector 310 (shown in FIG. 3.) The amplified and filtered output from phase detector 310 can be received by a second varactor diode 434 at the input VADJ, and by tuning microstrip line 436. A remote end of the tuning microstrip line 436 can couple to third varactor diode 438. In these and other embodiments of the present invention, first varactor diode 432, second varactor diode 434, and third varactor diode 438 can be formed of one, two, or more than two individual varactor diodes.

Dielectric resonator circuit 500 can include stub 439. Stub 439 can be an open length of microstrip line attached to first varactor diode 432. A length of stub 439 can be trimmed by cutting, laser cutting, Zener zapping, or other technique to adjust the input coupling of the dielectric resonator 410.

Figure 5:
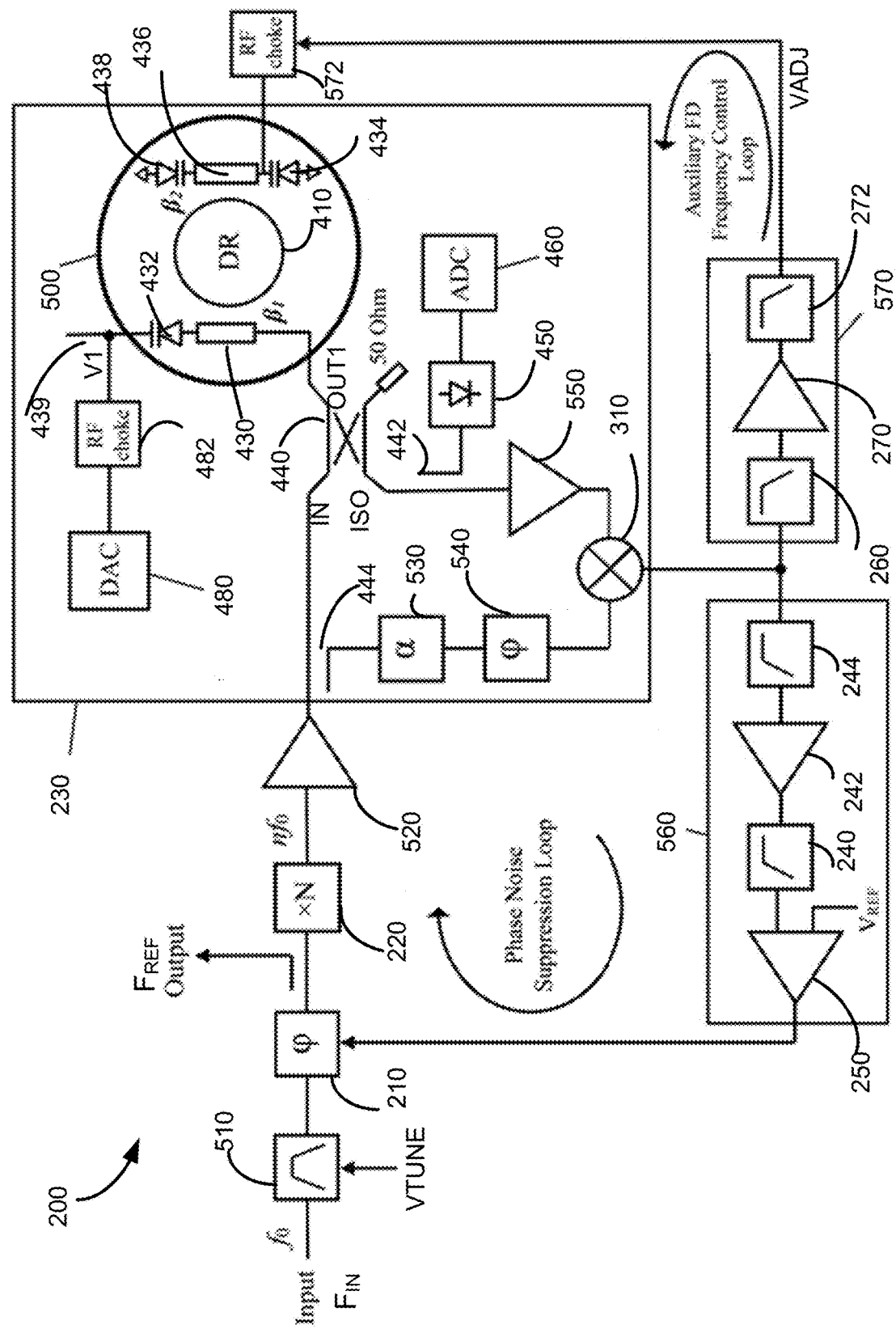
FIG. 5 is another block diagram of a phase-noise-suppression system according to an embodiment of the present invention.

FIG. 5 is another block diagram of a phase-noise-suppression system according to an embodiment of the present invention. Phase-noise-suppression system 200 can include an input narrow band bandpass filter 510 to remove high-frequency phase noise from input signal $F_{IN}$, which can be from a crystal oscillator, such as crystal oscillator 110 (shown in FIG. 1), or other oscillating component or circuit. Bandpass filter 510 can be a surface acoustic wave (SAW) filter, thin-film bulk acoustic resonator (FBAR), or other type of filter. The output of bandpass filter 510 can be received by a first voltage-controlled phase shifter 210. The first voltage-controlled phase shifter 210 can be used to subtract phase noise from the signal provided by bandpass filter 510. The output of first voltage-controlled phase shifter 210 can be provided as the output $F_{REF}$ of phase-noise-suppression system 200. The output of first voltage-controlled phase shifter 210 can be received by frequency multiplier 220. Frequency multiplier 220 can provide a second, fourth, or other odd or even harmonic of the output of first voltage-controlled phase shifter 210 to power amplifier 520. Frequency multiplier 220 can include one or more low noise Schottky diode or non-linear transmission line frequency multipliers. Power amplifier 520 can be used at the output of the frequency multiplier 220 to provide a high amplitude signal into frequency discriminator 230 to improve the signal-to-noise ratio of the signal at the output of frequency discriminator 230.

Frequency discriminator 230 can include hybrid coupler 440 that can receive the output of power amplifier 520. The output of power amplifier 520 can be provided by a first output port OUT1 of hybrid coupler 440 to an input microstrip line 430 of a resonator circuit, shown in this example as dielectric resonator circuit 500. Input microstrip line 430 can be further coupled to a first varactor diode 432 that can be used for non-dynamic tuning of dielectric resonator 410 in dielectric resonator circuit 500. Frequency fluctuations in the signal at the output OUT1 of hybrid coupler 440 can be converted to phase fluctuations by dielectric resonator circuit 500. A coupling coefficient from input microstrip line 430 to dielectric resonator 410 is shown as $BETA_1$.

The reverse coupled or isolated port ISO of hybrid coupler 440 can be coupled to low-noise amplifier 550. Typically, a signal strength of −20 to −30 dbm can be received by low-noise amplifier 550, while a signal strength of 5 to 10 dbm can be provided to phase detector 310 by low-noise amplifier 550. This signal can become a clipped square wave when a large frequency mismatch between the frequency of the signal provided by hybrid coupler 440 and the tuned frequency of the dielectric resonator circuit exists. When the frequency of the input to hybrid coupler 440 matches the tuned frequency of dielectric resonator 410, the dielectric resonator 410 can be at maximum efficiency and the input to low-noise amplifier 550 can be at or near zero. The output of power amplifier 520 can be coupled through directional coupler 444 to attenuator 530 that, along with directional coupler 444, can reduce the amplitude of the large signal provided by power amplifier 520. For example, directional coupler 444 can provide 10 to 15 dB of loss or attenuation. The output of attenuator 530 can be received by a second voltage-controlled phase shifter 540. Second voltage-controlled phase shifter 540 can be adjusted to maximize the sensitivity and amplitude noise suppression of phase detector 310. Phase detector 310 can compare a phase of the output of second voltage-controlled phase shifter 540 to the phase of signal at the output of low-noise amplifier 550 and provide a voltage having an amplitude proportional to the phase difference between the two.

The output of phase detector 310 can be received by main-loop amplifier circuit 560. Main-loop amplifier circuit 560 can include one or more filters and one or more amplifiers. For example, the main-loop amplifier circuit can include high-pass filter 240 and high-pass filter 244 interdigitated with amplifier 250 and amplifier 242. The output of main-loop amplifier circuit 560 can be received by first voltage-controlled phase shifter 210. This signal can subtract phase noise from the signal provided by the input bandpass filter 510.

The output of phase detector 310 can further be received by auxiliary-loop amplifier circuit 570. Auxiliary-loop amplifier circuit 570 can include one or more filters and one or more amplifiers. For example, auxiliary-loop amplifier circuit 570 can include low-pass filter 260 and low-pass filter 272 on each side of amplifier 270. The output of auxiliary-loop amplifier circuit 570 can be received by an adjustment or tuning input VADJ of dielectric resonator circuit 500 in frequency discriminator 230. For example, the output of auxiliary-loop amplifier circuit 570 can be received by a second varactor diode 434 and tuning microstrip line 436 in dielectric resonator circuit 500. RF choke 572 can be used to further filter and remove noise from the output of auxiliary-loop amplifier circuit 570. A remote end of tuning microstrip line 436 can be coupled to third varactor diode 438. In this way, the output of auxiliary-loop amplifier circuit 570 can be used to dynamically tune dielectric resonator 410. A coupling coefficient from tuning microstrip line 436 to dielectric resonator 410 is shown as $BETA_2$. In these and other embodiments of the present invention, second varactor diode 434 and third varactor diode 438 can be formed of one, two, or more than two individual diodes. Also, other capacitors can be place in parallel or series with second varactor diode 434 and third varactor diode 438 to adjust their tuning range.

In these and other embodiments of the present invention, the frequency responses of main-loop amplifier circuit 560 and auxiliary-loop amplifier circuit 570 can be different. For example, main-loop amplifier circuit 560 can operate at a higher frequency such that high frequency fluctuations in the input signal $F_{IN}$ are amplified and cancelled. The auxiliary-loop amplifier circuit 570 can have a low-pass response such that the dielectric resonator circuit 500 can be locked to the input signal so the frequency fluctuations of the dielectric resonator can be reduced. As an example, main-loop amplifier circuit 560 can have a gain of 30-40 dB and a 3 dB bandwidth of several tens of kHz. Auxiliary-loop amplifier circuit 570 can have a similar gain of 30-40 dB and a much lower 3 dB bandwidth, for example below 100 Hz. This low bandwidth can prevent auxiliary-loop amplifier circuit 570 from interfering with the dynamics of the phase-noise suppression by main-loop amplifier circuit 560 and voltage-controlled phase shifter 210. The resulting circuit can suppress phase noise in the range of several kHz to 1 MHz Dielectric resonator circuit 500 can be non-dynamically tuned or adjusted as well.

Specifically, the reverse coupled or isolated port ISO of hybrid coupler 440 can be coupled, for example using directional coupler 442, to power detector 450. Directional coupler 442 can provide a loss of 10 to 15 dB. The output of power detector 450 can be converted to a digital signal using analog-to-digital converter 460. The output of analog-to-digital converter 460 can be provided to a field-programmable gate array or other logic circuit 470 (shown in FIG. 4) for processing. Based on the output of power detector 450, digital-to-analog converter 480 can be set to provide a voltage to first varactor diode 432 in dielectric resonator circuit 500 to adjust the input coupling $BETA_1$ of the dielectric resonator 410 to provide a constant signal level to the input of the low-noise amplifier 550. The output of digital-to-analog converter 480 can be filtered by RF choke 482 and provided as voltage V1 to the junction of first varactor diode 432 and stub 439. Since this tuning is relatively slow and possibly software controlled, it can be referred to as non-dynamic or DC tuning. In these and other embodiments of the present invention, first varactor diode 432 can be formed of one, two, or more than two individual diodes. Also, other capacitors can be place in parallel or series with first varactor diode 432 to adjust its tuning range.

Figure 6:
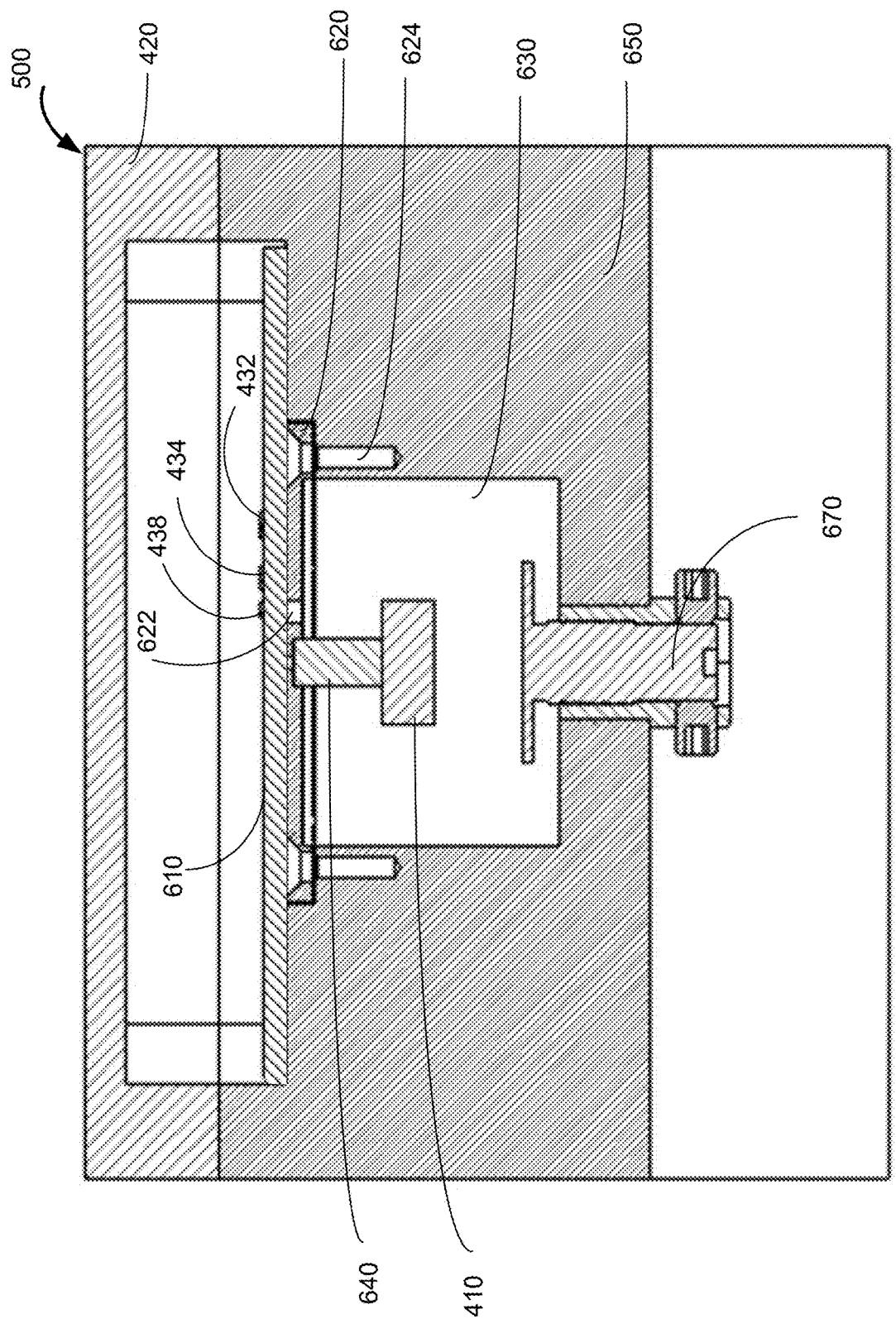
FIG. 6 is a cutaway side-view of a dielectric resonator circuit according to an embodiment of the present invention.

FIG. 6 is a cutaway side-view of a dielectric resonator circuit according to an embodiment of the present invention. Dielectric resonator circuit 500 can include a metal cavity 630 formed in base 650 and covered by cavity lid 620. Dielectric resonator circuit 500 can include a dielectric puck or dielectric resonator 410. Dielectric resonator 410 can be attached to cavity lid 620 by rod 640. Dielectric resonator 410 can be formed of a first type of ceramic while rod 640 can be formed of a second type of ceramic. For example, rod 640 can be formed of a low-loss ceramic such as alumina, quartz, or other material. Dielectric resonator 410 can operate in the traverse electric TE (01 delta) mode. Using this resonant mode at the higher frequency provided by frequency multiplier 220 (shown in FIG. 2) can reduce the size of dielectric resonator circuit 500. Dielectric resonator 410 can be glued or otherwise attached to rod 640. Rod 640 can be glued or otherwise attached to cavity lid 620. A tuning screw 670 can be partially located in cavity 630. Cavity lid 620 can be attached to base 650, for example using fasteners 624. Printed circuit board 610 can be placed over cavity lid 620. Printed circuit board 610 can be attached to base 650, cavity lid 620, or both, using glue or other adhesive. Printed circuit board 610 can include a ground plane 730 (shown in FIG. 7) having a first slit 710 and a second slit 720 (both shown in FIG. 7.) Input microstrip line 430 (shown in FIG. 7) can extend over first slit 710 while tuning microstrip line 436 (shown in FIG. 7) can extend over second slit 720. First varactor diode 432, second varactor diode 434, and third varactor diode 438 can be located on a top surface of printed circuit board 610 and attached to input microstrip line 430 and tuning microstrip line 436. Cavity lid 620 can include cutouts 622 aligned with first slit 710 and second slit 720. Cover 420 can be attached to base 650 over printed circuit board 610.

Figure 7:
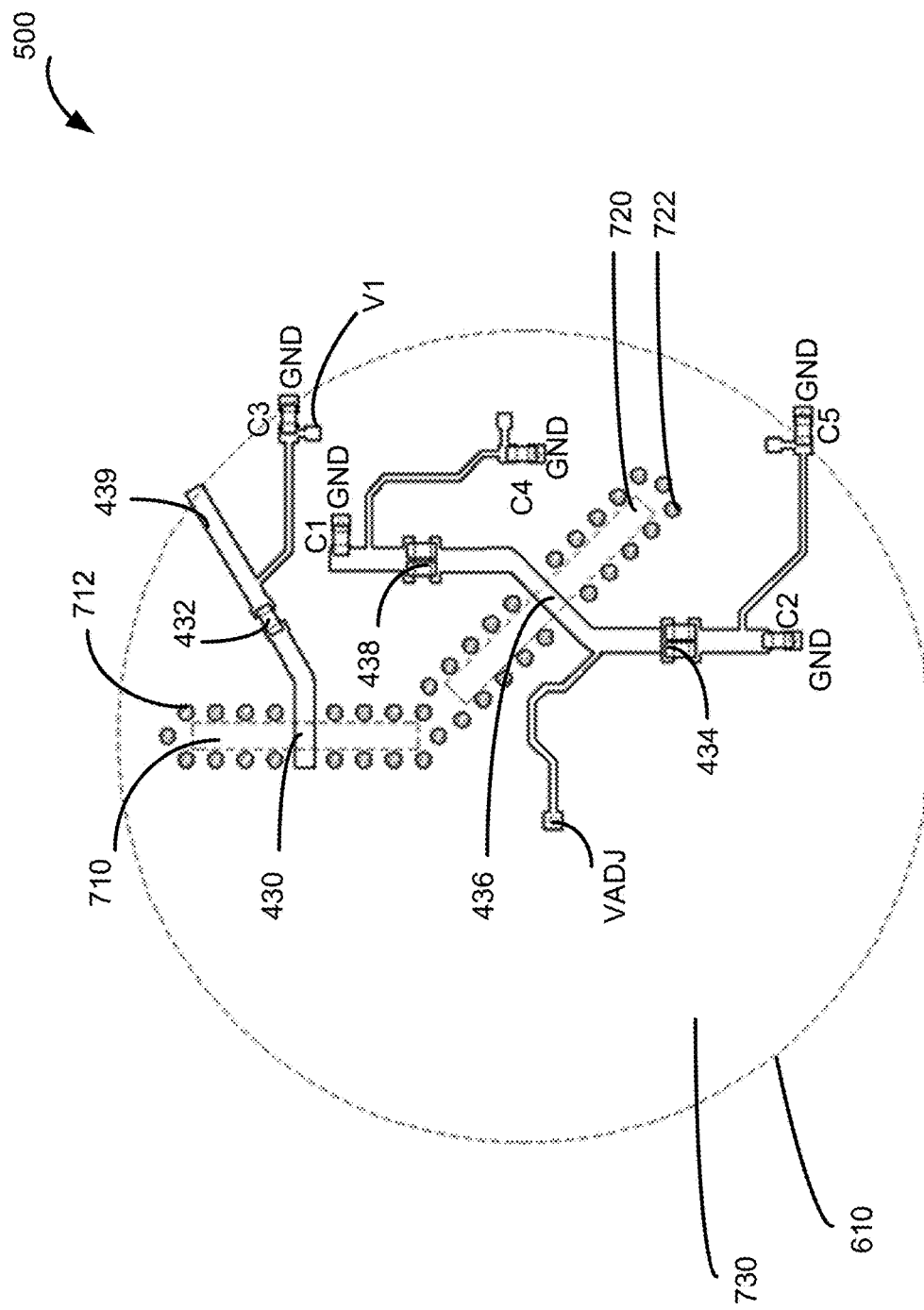
FIG. 7 is a top view of a printed circuit board and components for a dielectric resonator circuit according to an embodiment of the present invention.

FIG. 7 is a top view of a printed circuit board and components for a dielectric resonator circuit according to an embodiment of the present invention. Dielectric resonator circuit 500 can include printed circuit board 610. Printed circuit board 610 can include ground plane 730. First slit 710 and second slit 720 can be formed in ground plane 730. Stitching vias 712 and stitching vias 722 can be positioned around first slit 710 and second slit 720. Slits can be formed small enough to not resonate while providing coupling. Stitching vias 712 and stitching vias 722 can further help to reduce signal dispersion outside of first slit 710 and second slit 720. Input microstrip line 430 can be placed over first slit 710. First slit 710 can be aligned with a cutout 622 (shown in FIG. 6) to allow coupling to dielectric resonator 410 (shown in FIG. 6) by input microstrip line 430. This coupling can allow the signal on input microstrip line 430 to drive the dielectric resonator 410. Tuning microstrip line 436 can be placed over second slit 720. Second slit 720 can be aligned with a cutout 622 to allow coupling to dielectric resonator 410. This coupling can allow the tuning of dielectric resonator 410 by the auxiliary-loop including auxiliary-loop amplifier circuit 570 (shown in FIG. 5.) First varactor diode 432 can be attached to printed circuit board 610 and input microstrip line 430. Open stub 439 can be a portion of a microstrip line attached to first varactor diode 432. A length of stub 439 can be tuned or adjusted to vary the tuning range of dielectric resonator 410. This length can be adjusted by cutting, lasering, Zener zapping, or other technique.

The voltage provided by digital-to-analog converter 480 can be received as V1 at the junction of first varactor diode 432 and stub 439. The voltage V1 can set a reverse bias voltage for first varactor diode 432, thereby adjusting its capacitance. As its capacitance changes, so does the input coupling coefficient of the dielectric resonator 410. The output of auxiliary-loop amplifier circuit 570 (shown in FIG. 5) can be received at the VADJ node by tuning microstrip line 436. Tuning microstrip line 436 can be coupled to second varactor diode 434 and third varactor diode 438. The voltage VADJ can set reverse bias voltages for second varactor diode 434 and third varactor diode 438, thereby adjusting their capacitance. As their capacitance changes, so does the tuned frequency of dielectric resonator circuit 500. Second varactor diode 434 can be in series with capacitor C2, which can be included to adjust the tuning range of second varactor diode 434. Third varactor diode 438 can be in series with capacitor C1, which can be included to adjust the tuning range of third varactor diode 438. Capacitors C3, C4, and C5 can be used in the varactor bias networks to provide a low impedance to ground at the resonator frequency.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A phase-noise-suppression system comprising:
an input path comprising a first voltage-controlled phase shifter in series with a frequency multiplier, the input path having an input configured to couple to a signal source external to the phase-noise suppression system;
a frequency discriminator having an input coupled to an output of the input path;
a first amplifier path having an input coupled to an output of the frequency discriminator and an output coupled to a control input of the first voltage-controlled phase shifter; and
a second amplifier path having an input coupled to the output of the frequency discriminator and an output coupled to a control input of the frequency discriminator.

2. The phase-noise-suppression system of claim 1 wherein the frequency discriminator comprises a dielectric resonator circuit.

3. The phase-noise-suppression system of claim 2 wherein an input of the frequency multiplier is coupled to an output of the first voltage-controlled phase shifter.

4. The phase-noise-suppression system of claim 3 wherein the input path further comprises a power amplifier coupled between the first voltage-controlled phase shifter and the frequency discriminator.

5. The phase-noise-suppression system of claim 4 wherein the first amplifier path comprises a high-pass filter and a first amplifier.

6. The phase-noise-suppression system of claim 5 wherein the second amplifier path comprises a low-pass filter and a second amplifier.

7. The phase-noise-suppression system of claim 6 wherein the input path further comprises an input filter having an output coupled to an input of the first voltage-controlled phase shifter.

8. The phase-noise-suppression system of claim 7 wherein the frequency discriminator comprises:
a hybrid coupler coupled to an output of the power amplifier, the dielectric resonator circuit, and a low-noise amplifier;
an attenuator coupled to the output of the power amplifier; and
a phase detector coupled to the attenuator and the low-noise amplifier, and having an output coupled to the output of the frequency discriminator.

9. The phase-noise-suppression system of claim 8 further comprising a second voltage controlled phase shifter coupled between the attenuator and the phase detector.

10. The phase-noise-suppression system of claim 9 wherein the input filter comprises a bandpass filter.

11. A phase-noise-suppression system comprising:
an input path comprising a voltage-controlled phase shifter in series with a frequency multiplier, the input path having an input configured to couple to a signal source external to the phase-noise suppression system;
a phase detector having an input coupled to an output of the input path;
a dielectric resonator circuit having an input coupled to the output of the input path and an output coupled to the phase detector;
a first amplifier path having an input coupled to an output of phase detector and an output coupled to a control input of the voltage-controlled phase shifter; and
a second amplifier path having an input coupled to the output of the phase detector and an output coupled to a control input of the dielectric resonator circuit.

12. The phase-noise-suppression system of claim 11 wherein an input of the frequency multiplier is coupled to an output of the voltage-controlled phase shifter.

13. The phase-noise-suppression system of claim 12 wherein the input path further comprises a power amplifier coupled between the voltage-controlled phase shifter and the dielectric resonator circuit.

14. The phase-noise-suppression system of claim 13 wherein the first amplifier path comprises a high-pass filter and a first amplifier.

15. The phase-noise-suppression system of claim 14 wherein the second amplifier path comprises a low-pass filter and a second amplifier.

16. A dielectric resonator circuit comprising:
a base forming a cavity;
a cavity lid over the cavity;
a dielectric puck attached to the cavity lid;
a printed circuit board over the cavity lid, the printed circuit board including a first slit formed in a ground plane and a second slit formed in the ground plane;
a cover over the printed circuit board;
a first micro strip line over the first slit;
a second microstrip line over the second slit;
a first varactor diode attached to the first micro strip line;
a second varactor diode attached near a first end of the second microstrip line; and
a third varactor diode attached near a second end of the second micro strip line.

17. The dielectric resonator circuit of claim 16 wherein the first microstrip line comprises a stub such that the first varactor diode is between the first slit and the stub.

18. The dielectric resonator circuit of claim 17 wherein the cavity lid comprises a first cutout aligned with the first slit and a second cutout aligned with the second slit.

19. The dielectric resonator circuit of claim 18 further comprising a rod connecting the dielectric puck to the cavity lid.

20. The dielectric resonator circuit of claim 19 wherein the rod is formed of a first ceramic and the dielectric puck is formed of a second ceramic, the first ceramic different from the second ceramic.

* * * * *